United States Patent
Parris et al.

(10) Patent No.: US 7,099,234 B2
(45) Date of Patent: Aug. 29, 2006

(54) LOW POWER SLEEP MODE OPERATION TECHNIQUE FOR DYNAMIC RANDOM ACCESS MEMORY (DRAM) DEVICES AND INTEGRATED CIRCUIT DEVICES INCORPORATING EMBEDDED DRAM

(75) Inventors: Michael C. Parris, Colorado Springs, CO (US); Oscar Frederick Jones, Jr., Colorado Springs, CO (US); Douglas Blaine Butler, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 180 days.

(21) Appl. No.: 10/878,925

(22) Filed: Jun. 28, 2004

(65) Prior Publication Data

US 2005/0286339 A1    Dec. 29, 2005

(51) Int. Cl.
  *G11C 8/00* (2006.01)
(52) U.S. Cl. .................. 365/236; 365/222; 365/233
(58) Field of Classification Search ................ 365/236, 365/222, 233
  See application file for complete search history.

(56) References Cited

U.S. PATENT DOCUMENTS

| | | | |
|---|---|---|---|
| 5,365,487 A | 11/1994 | Patel et al. | |
| 5,430,680 A | 7/1995 | Parris | |
| 5,835,937 A | 11/1998 | Miyoshi | |
| 5,940,851 A | 8/1999 | Leung | |
| 5,959,925 A | 9/1999 | Tatsumi | |
| 6,067,261 A | 5/2000 | Vogelsang et al. | |
| 6,172,928 B1 * | 1/2001 | Ooishi | 365/222 |
| 6,381,188 B1 | 4/2002 | Choi et al. | |
| 6,765,838 B1 * | 7/2004 | Matsumoto et al. | 365/222 |
| 6,876,593 B1 * | 4/2005 | Shi et al. | 365/222 |
| 6,947,346 B1 * | 9/2005 | Shore et al. | 365/236 |
| 2004/0196719 A1 * | 10/2004 | Aritomi et al. | 365/222 |

* cited by examiner

*Primary Examiner*—Tuan T. Nguyen
(74) *Attorney, Agent, or Firm*—William J. Kubida; Hogan & Hartson LLP

(57) ABSTRACT

A low power Sleep Mode operation technique for dynamic random access (DRAM) devices and integrated circuit devices incorporating embedded DRAM. By counting clock (CLK) cycles in accordance with the technique disclosed, refresh time ($t_{REF}$) does not vary with all possible process corners, voltages and temperatures (PVT) since the clock signal exhibits a steady frequency over PVT applied to the DRAM and an internal timer placed on chip will vary directly with these parameters. After entering Sleep Mode, the main internal clock signal is inhibited from propagating around the device chip and, at this time, much of the associated circuitry can be power-gated to conserve power, typically with signals that have a boosted level to provide a negative gate-to-source voltage ($V_{GS}$) on the power-gating transistors.

25 Claims, 2 Drawing Sheets

LOW POWER SLEEP MODE OPERATION TECHNIQUE FOR DYNAMIC RANDOM ACCESS MEMORY (DRAM) DEVICES AND INTEGRATED CIRCUIT DEVICES INCORPORATING EMBEDDED DRAM

BACKGROUND OF THE INVENTION

The present invention relates, in general, to the field of integrated circuit (IC) devices. More particularly, the present invention relates to a low power Sleep Mode operation technique for dynamic random access (DRAM) devices and integrated circuit devices incorporating embedded DRAM.

DRAM memory devices incorporate one or more arrays of memory cells, each generally consisting of a single transistor and associated capacitor. The transistor has one terminal coupled to an associated bit line and its gate coupled to a word line. Another terminal is generally coupled to circuit ground through the capacitor and by enabling the transistor via the word line, the charge on the capacitor may be placed on the associated bit line. Due to the dynamic nature of the charge stored in the capacitor, it must be periodically refreshed to replenish the leaked charge.

A "refresh" or "active" command can occur on any clock cycle in an integrated circuit memory, requiring internal (on-chip) detection of the cycle type being executed. This detection process slows down the row address path within the device. On-chip refresh circuitry has been incorporated in DRAM designs for several decades. When first introduced, a separate refresh pin was used to inform the DRAM to execute a refresh operation using internally generated addresses instead of a normal, externally supplied row address. Later, /CAS-before-/RAS (CAS=column address strobe, and RAS=row address strobe) commands were used to enable on-chip refresh cycles. When /CAS was "high" and /RAS went "low", a normal row selection was done using the external address supplied to the time when /RAS went "low". However, if /CAS was "low" when /RAS went "low", then a refresh operation was executed using an internally generated refresh address.

Conventional DRAMs currently support two different types of refresh operations: auto-refresh and self-refresh. Auto-refresh uses a specific command instruction: /CS (chip select), /RAS, and /CAS "low" with /WE (write enable) "high" that is sampled at the rising edge of the DRAM's input clock signal. The self-refresh command is similar to auto-refresh, but occurs concurrently with entering power-down mode. In self-refresh operation, the device periodically executes refresh cycles (which are self-timed) to maintain stored data integrity during power-down mode.

In the past, incorporating on-chip refresh techniques using the methods described above had little impact on device performance. However, as the operating frequency of DRAMs and SDRAMs has increased, the inclusion of on-chip refresh using conventional methods has had an impact on row access performance. With present methods, during any cycle that an active command can be executed, a refresh command could have been executed instead, provided the device had been previously idle (in precharge state.) For this reason, the on-chip circuitry must hold-off row selection while the appropriate address is selected, depending on whether the present instruction is an "active" or a "refresh" command. This process is complicated in most instances and a command address latch is used to hold either the externally supplied row address or the internally generated address from the refresh address counter depending on the command. As clock rate increases, the operational time penalty due to selecting which address to use before row selection can be enabled will become a larger percentage of the row select time.

Further, with conventional DRAM-based memory technology, open memory banks must be closed prior to the issuance of a "refresh" command. These banks are required to be closed by issuing individual "precharge" commands to open banks using a "precharge all" to close open banks or "auto-precharge" commands for "read" or "write" cycles to ensure that an opened bank has been closed (or precharged) prior to issuing a refresh command.

Despite these technological advances, conventional memory devices, and those incorporating embedded memory, do not accurately time when a refresh operation is required over all possible process corners, voltages and temperatures (PVT) and do not sufficiently lower transistor leakage power in all circuit blocks accordingly. Further, conventional techniques do not employ "active" power-gating techniques wherein various circuit blocks can be powered-up or powered-down as required during a refresh operation.

SUMMARY OF THE INVENTION

The present invention overcomes the aforementioned and other deficiencies of conventional approaches to conducting refresh operation in DRAM-based memory devices and those incorporating embedded DRAM. By counting clock (CLK) cycles in accordance with the technique disclosed herein, refresh time ($t_{REF}$) does not vary with PVT since the clock signal exhibits a steady frequency over PVT applied to the DRAM and an internal timer placed on chip will vary directly with these parameters.

After entering Sleep Mode (ZZ mode), the main internal clock signal (ICLK) is inhibited from propagating around the device chip or embedded memory. Also at this time, much of the associated circuitry can be power-gated to conserve power, typically with signals that have a boosted level to provide a negative gate-to-source voltage ($V_{GS}$) on the power-gating transistors.

Among the advantageous features of the present invention include the use of the externally supplied clock signal to provide a count of the desired number of clock transitions to determine the refresh delay or retention time required for each memory cell. By generating and using a $\frac{1}{4}^{th}$, $\frac{1}{8}^{th}$, $\frac{1}{16}^{th}$ or other reduced clock frequency from the external clock, the lower frequency clock can be routed over to Sleep Mode circuitry and the CdV/dT power minimized.

The technique of the present invention further provides for the power-gating "on" and "off" of related row address circuitry. This reduces transistor leakage for the majority of the Sleep Mode operation time and may be effectuated with a boosted power-gate signal level. A delay may be added between the turning "off" of the power-gating signal and the subsequent enabling of the related circuitry such that the internal power supplies have time to achieve the proper supply (VCC) and reference (VSS) levels. Those circuits not related to refresh operation may be kept "off" for the entire Sleep Mode operation with, for example, a boosted power-gated level. This reduces transistor leakage for the entire Sleep Mode operation time.

For advanced semiconductor technologies, transistor "off" current, or leakage, is a large contributor to DRAM standby power usage. That is, as transistor channel lengths become shorter, it becomes increasingly more difficult to have low levels of current when VSS=0 volts, especially over all PVT conditions. The present invention minimizes the overall DRAM power usage while maintaining data in the array by employing the aforementioned techniques.

Particularly disclosed herein is a method for reducing power in a dynamic random access memory array having a Sleep Mode of operation comprising furnishing a clock signal at a first frequency to the memory array, reducing the first frequency to a second lower frequency clock signal, counting transitions of the second lower frequency clock signal and initiating a refresh operation to at least a portion of the memory array upon reaching a predetermined count of the transitions.

Further disclosed herein is an integrated circuit device including a dynamic random access memory array having a Sleep Mode of operation comprising a reduced rate clock generator coupled to receive a first clock signal at a first frequency and produce a second clock signal at a second lower frequency and a refresh timer counter coupled to receive the second clock signal and provide a refresh initiation signal to enable a refresh operation to the memory array in response to receipt of a predetermined number of transitions of the second clock signal. In a more particular embodiment of the present invention there is also provided a power control circuit coupled to the refresh timer counter for selectively powering-down at least a portion of circuitry peripheral to the memory array not required during the refresh operation.

Also further disclosed herein is a method for reducing power in a dynamic random access memory array comprising furnishing a clock signal to the memory array, counting transitions of the clock signal and initiating a refresh operation to at least a portion of the memory array upon reaching a predetermined count of the transitions.

Still further disclosed herein is an integrated circuit device including a dynamic random access memory array comprising a clock generator for producing a clock signal for the integrated circuit device and a refresh timer counter coupled to receive the clock signal and provide a refresh initiation signal to enable a refresh operation to the memory array in response to receipt of a predetermined number of transitions of the clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
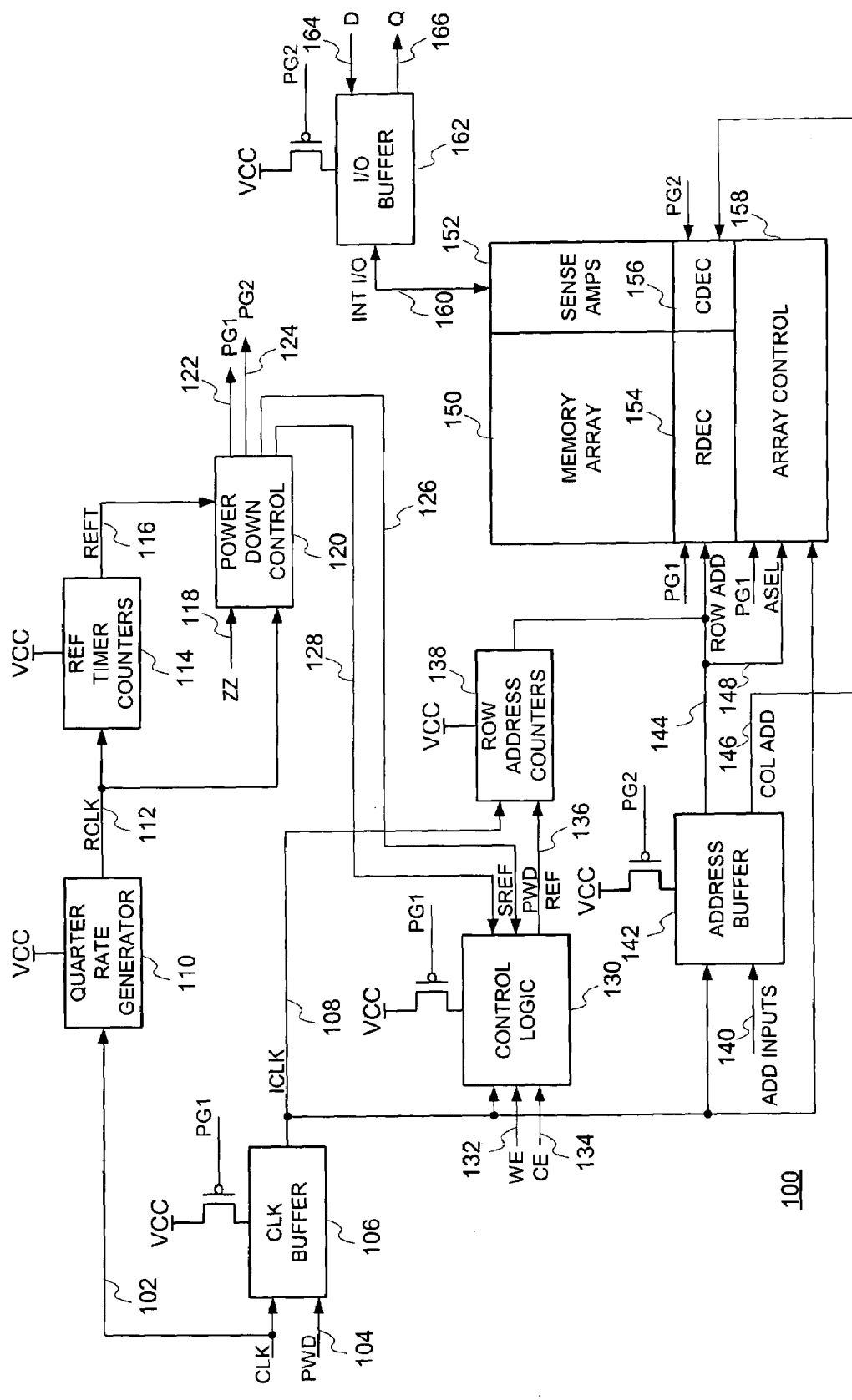
FIG. 1 is a functional block diagram of a portion of an integrated circuit device incorporating a memory array and implementing a representative embodiment of the low power Sleep Mode operation technique of the present invention.

With reference now to FIG. 1, a functional block diagram of a portion of an integrated circuit device 100 incorporating a memory array and implementing a representative embodiment of the low power Sleep Mode operation technique of the present invention is shown. As will be used herein, the following definitions pertain:

ClK—the externally applied clock to the embedded DRAM or memory device;

RCLK—the reduced rate clock which may be $\frac{1}{4}^{th}$, $\frac{1}{8}^{th}$, $\frac{1}{16}^{th}$ or other fraction of the externally applied CLK signal;

ZZ—the externally applied Sleep Mode command;

PWD—the power down, enable/disable signal to turn "off" various circuit blocks;

PG1—the power-gate #1 signal which turns "on" and "off" as required;

PG2—the power-gate #2 signal which remains "off" for the entire Sleep Mode time;

REFT—the refresh timer signal which goes "high" when a refresh operation is needed;

SREF—the start refresh signal which is asserted after the REFT, PG1 and PWD signals;

REF—the refresh signal. A refresh operation occurs when this signal is "high". Typically, a burst refresh is used so that all the word lines in a memory array, or in a subarray of a memory array, are refreshed sequentially. After the last row has been refreshed, the REF signal goes "low", followed by PG1 and PWD;

ICLK—the internal clock signal which is a full rate, buffered version of the external CLK signal;

INT I/O—the internal I/O lines;

ASEL—the array select signal which may be the most significant bit (MSB) row address bits.

As indicated, the device 100 receives as two of its inputs, a clock (CLK) signal on line 102 and a power down (PWD) enable/disable signal on line 104 which are applied to a clock buffer circuit 106 which has a supply voltage (VCC) thereto selectively enabled or disabled dependent upon the state of a power-gate #1 (PG1) signal as indicated.

The clock buffer circuit 106 provides, as output, an internal clock (ICLK) signal on line 108 which is a full-rate, buffered version of the input CLK signal on line 102. A quarter rate generator 110 also receives as input the CLK signal on line 102 to provide a reduced rate clock signal (RCLK) on line 112 for input to refresh timer counters 114 and a power down (PWD) control block 120. The refresh timer counters 114 provide a refresh timer (REFT) signal on line 116 for further input to the power down control block 120 along with an externally applied Sleep Mode command (ZZ) on line 118.

The power down control block 120 produces a power-gate #1 signal on line 122 an a power-gate #2 signal on line 124 as will be more fully described hereinafter. It also provides a PWD enable/disable signal on line 126 and a start refresh (SREF) signal on line 128 for input to a control logic block 130 which has VCC supply voltage thereto gated by the PG1 signal on line 122. The control logic block also receives the ICLK signal on line 108 as well as a write enable (WE) signal on line 132 and a chip enable (CE) signal on line 134 to provide a refresh (REF) signal at its output to row address counters 138, which is also coupled to receive the ICLK signal on line 108. The row address counters 138 have an output thereof coupled to a row address (ROW ADD) line 144.

The ICLK signal is also input to an address buffer 142 which also receives address inputs on line 140. Supply voltage to the address buffer 142 is controlled by the PG2 signal on line 124 as indicated. The address buffer 142 provides a row address signal on line 144 for input to a row decoder (RDEC) circuit 154, associated with a memory array 150, from which is also derived an array select (ASEL) signal for input to an array control block 158. The row decoder 154 and array control block 158 are also controlled by the PG1 signal on line 122, the latter also coupled to receive the ICLK signal on line 108. The address buffer 142 also produces a column address (COL ADD) signal on line 146 for input to a column decoder (CDEC) circuit 156 which also has as input the PG2 signal on line 124.

A number of sense amplifiers (sense amps) 152 are also associated with the memory array 150 through which data may be written to the memory array 150 or read therefrom. A bi-directional internal input/output (INT I/O) bus couples the sense amplifiers to an I/O buffer 162 which has its supply voltage gated by the PG2 signal on line 124. The I/O buffer 162 receives data for input to the memory array 150 on input data (D) line, or bus, 164 while data read from the memory array 150 is output on output data (Q) line, or bus, 166.

Figure 2:
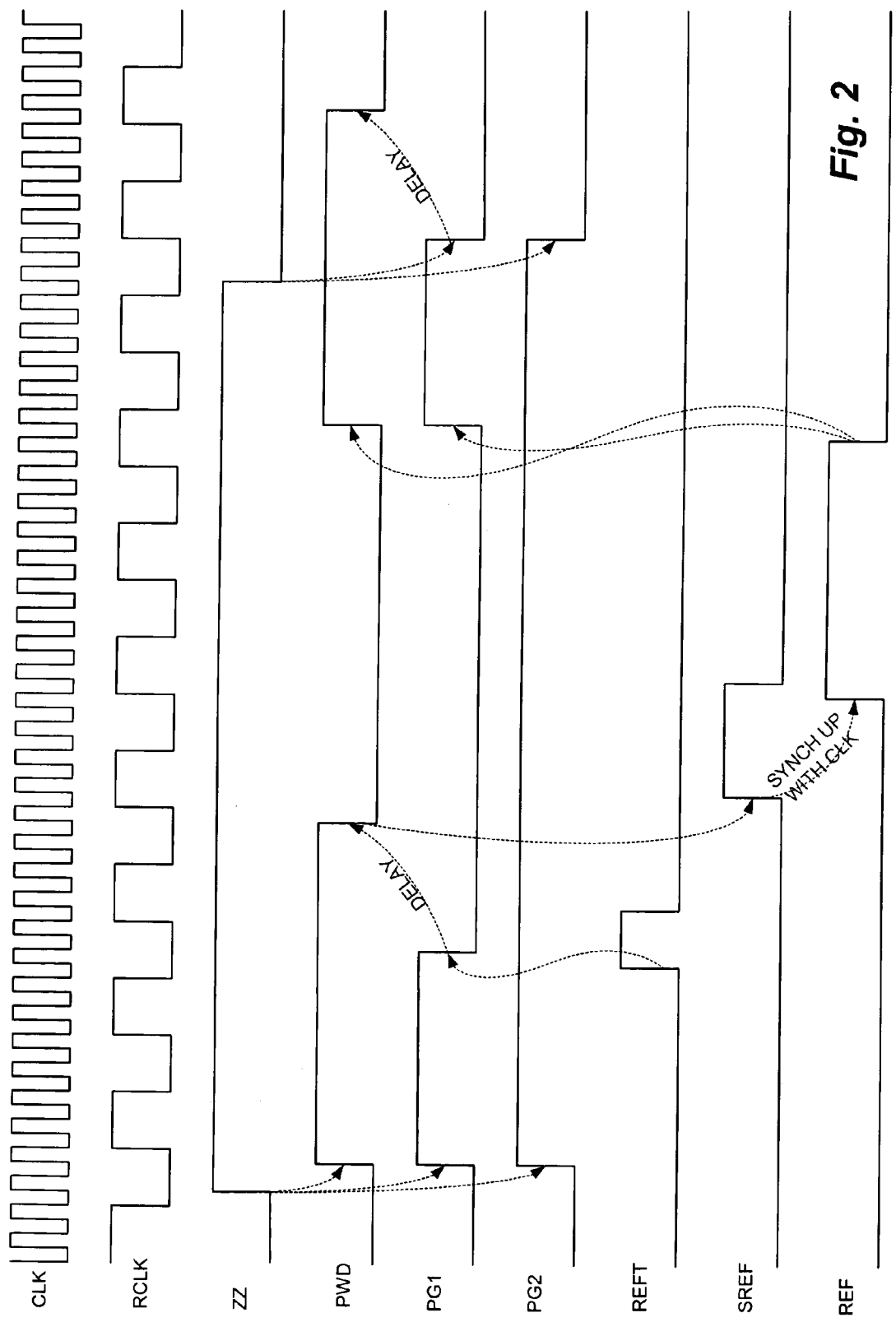
FIG. 2 is a graphical illustration of the relative timing of a number of the signals indicated in the preceding figure with respect to the reduced rate clock (RCLK) signal derived from the input clock (CLK) signal.

With reference additionally now to FIG. 2, a graphical illustration of the relative timing of a number of the signals indicated in the preceding figure is shown with respect to the reduced rate clock (RCLK) signal derived from the input clock (CLK) signal.

In operation, the clock (CLK) input on line 102 to a clocked DRAM (or clocked embedded DRAM) forming a portion of the device 100 is divided down by a predetermined factor, which, in the exemplary implementation illustrated, is a factor of four provided by the quarter rate generator 110. This reduced frequency rate clock (RCLK) is routed via line 112 to the refresh control circuitry and clock counter circuitry comprising refresh timer counters 114 and power down control block 120.

Since any signal on an integrated circuit device has capacitance associated with it, and since I=CdV/dT, by increasing the value of dT (delta Time), the value of I (current) is reduced. The clock counter circuitry of the refresh timer counters 114 counts up to a predetermined count that is short enough so that correct data is correctly maintained in the memory cells of the memory array 150, but long enough so that a refresh operation doesn't occur too quickly, wasting power. The actual count to initiate a refresh operation to the memory array 150 is a matter of design choice and will generally be selected so that there is just sufficient charge in the memory cell capacitors such that it can still be sensed correctly. Once this count has been met, the power-gating signal PG1 on line 122 will go "low" and the related circuit blocks which have their supply voltage gated by this signal will be powered up.

At some predetermined delay later, the PWD signal on line 126 will go "low". This particular delay is utilized so that the power-gated VCC blocks (and/or power-gated VSS blocks, where implemented) will have time to achieve their full VCC and VSS levels. The PWD signal on line 126 going "low" then causes the start refresh (SREF) signal on line 128 to go "high", which then causes the REF signal on line 136 to a logic "high" state and the burst refresh operation can begin.

The burst refresh length can, in a representative embodiment, be any number between one and the total number of word lines (WL) in the memory array 150. Typical numbers may be the number of word lines in a sub array or the total number of word lines in the DRAM itself. After the set number of word lines have been accessed, a second counter, i.e. row address counters 138, will reach their full count and signal that the refresh operation is now done. At this point, the PG1 signal on line 122 and the PWD signal on line 126 can transition back to a logic "high" state, and the DRAM is now returned to its low power, low leakage state.

The process of counting clocks to determine the $t_{REF}$ delay time, powering up only the necessary blocks, completing a burst refresh operation and then powering down these blocks continues until the DRAM exits its Sleep (ZZ) mode. In this manner, data is maintained in a valid state in the memory array 150 with the lowest overall power being consumed. The signal PG2 on line 124 will stay "high" the entire time the device 100 is in the Sleep Mode since it is used to power-gate circuitry not required for refreshing the memory array 150, for example, the column decoders 156 and I/O buffer 162. Still other functional elements of the device 100 circuitry are not power-gated at all, with the PG1 and PG2 signals, among these are the RCLK generator (e.g. the quarter rate generator 110) and the counters for generating $t_{REF}$ (e.g. the refresh timer counters 114 and row address counters 138). These circuit blocks may be designed with longer than minimum transistor gate lengths and careful attention to minimize the capacitance on nodes that move with relatively high frequency.

In a particular implementation of the present invention, each CLK or ICLK clock period will select a word line, sense data, de-select the word line and precharge the bit lines when the burst refresh is in progress. Therefore, counting the number of word lines to be selected during the burst refresh is tantamount to counting the number of ICLK cycles. In this case, $t_{RC}=t_{CLK}$, where the $t_{RC}$ is the random cycle time, or row address strobe (RAS) cycle time (which equals the word line cycle time). $t_{RC}$ can easily be selected to be multiple clock cycles or some internally timed frequency (asynchronous) while still implementing the technique of the present invention.

While there have been described above the principles of the present invention in conjunction with specific circuitry and timing, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for reducing power in a dynamic random access memory array comprising:
   furnishing a clock signal to said memory array;
   counting transitions of said clock signal; and
   initiating a refresh operation to at least a portion of said memory array upon reaching a predetermined count of said transitions; wherein said counting transitions of said clock signal and said initiating a refresh operation occur during a Sleep Mode of operation.

2. The method of claim 1 wherein said predetermined count is representative of a time sufficient to ensure accurate sensing of data in said memory array before initiating said refresh operation.

3. The method of claim 2 wherein said predetermined count is representative of a time wherein said initiating said refresh operation does not occur substantially more rapidly than required to ensure said accurate sensing of said data. operation.

4. The method of claim 1 further comprising:
enabling at least one circuit peripheral to said memory array required for said refresh operation that has been powered-down in said Sleep Mode of operation prior to initiating said refresh operation.

5. The method of claim 1 further comprising:
generating a second clock signal having a reduced frequency with respect to said clock signal; and
counting transitions of said second clock signal instead of said clock signal.

6. The method of claim 4 further comprising:
delaying said initiating of said refresh operation following said enabling of said at least one circuit peripheral to said memory array for a predetermined time period.

7. The method of claim 6 wherein said predetermined time period is sufficient to allow said at least one circuit peripheral to said memory array to be fully enabled.

8. The method of claim 1 further comprising:
reducing said clock signal to a lower frequency clock signal by dividing said clock signal by a predetermined factor to produce said lower frequency clock signal.

9. The method of claim 8 wherein said predetermined factor is a factor of two or more.

10. The method of claim 1 wherein said refresh operation is a burst refresh operation.

11. The method of claim 1 further comprising:
signaling completion of said refresh operation upon reaching a second predetermined count of said transitions following initiating said refresh operation.

12. The method of claim 1 further comprising:
powering up circuitry peripheral to said memory array not necessary for said refresh operation upon said memory array exiting said Sleep Mode of operation.

13. The method of claim 1 further comprising:
inhibiting a primary internal clock signal during said Sleep Mode of operation.

14. An integrated circuit device including a dynamic random access memory array comprising:
a clock generator for producing a clock signal for said integrated circuit device; and
a refresh timer counter coupled to receive said clock signal and provide a refresh initiation signal to enable a refresh operation to said memory array in response to receipt of a predetermined number of transitions of said clock signal; wherein said refresh operation occurs during a Sleep Mode of operation.

15. The integrated circuit device of claim 14 further comprising:
a power control circuit coupled to said refresh timer counter for selectively powering-down at least a portion of circuitry peripheral to said memory array not required during said refresh operation.

16. The integrated circuit device of claim 15 wherein said power control circuit is further operative to initiate enablement of said at least a portion of circuitry peripheral to said memory array necessary for said refresh operation.

17. The integrated circuit device of claim 16 wherein said power control circuit is further operative to ensure said at least a portion of circuitry peripheral to said memory array necessary for said refresh operation is powered-up in advance of initiation of said refresh operation.

18. The integrated circuit device of claim 16 wherein said power control circuit is also operative to ensure that said at least a portion of said circuitry peripheral to said memory array necessary for said refresh operation is powered-down following completion of said refresh operation.

19. The integrated circuit device of claim 14 wherein said power control circuit is further operative to control power to additional circuitry peripheral to said memory array required for operation of said device upon exit of said device from said Sleep Mode of operation.

20. The integrated circuit device of claim 15 wherein said refresh timer counter and said power control circuit are operative to ensure that said refresh operation occurs at a rate sufficient to ensure accurate sensing of data in said memory array.

21. The integrated circuit device of claim 20 wherein said refresh timer counter and said power control circuit are operative to ensure that said refresh operation does not occur substantially more rapidly than required to ensure said accurate sensing of said data.

22. The integrated circuit device of claim 14 wherein said refresh timer counter and said power control circuit are operative to inhibit a primary internal clock signal during said Sleep Mode of operation.

23. The integrated circuit device of claim 14 wherein said clock generator comprises a reduced rate clock generator coupled to receive a first clock signal at a first frequency and produce a second clock signal at a second lower frequency and said refresh timer counter is coupled to receive said second clock signal and provide said refresh initiation signal in response to receipt of a predetermined number of transitions of said second clock signal.

24. The integrated circuit device of claim 23 wherein said refresh timer counter is operative to divide said clock signal by a predetermined factor to produce a second clock signal at a second lower frequency.

25. The integrated circuit device of claim 24 wherein said predetermined factor is two or more.

* * * * *

UNITED STATES PATENT AND TRADEMARK OFFICE
CERTIFICATE OF CORRECTION

| | | |
|---|---|---|
| PATENT NO. | : 7,099,234 B2 | Page 1 of 1 |
| APPLICATION NO. | : 10/878925 | |
| DATED | : August 29, 2006 | |
| INVENTOR(S) | : Michael C. Parris, Oscar Frederick Jones, Jr. and Douglas Blaine Butler | |

It is certified that error appears in the above-identified patent and that said Letters Patent is hereby corrected as shown below:

Column 7, line 2, after "data" delete "."

Signed and Sealed this

Nineteenth Day of December, 2006

JON W. DUDAS
*Director of the United States Patent and Trademark Office*